United States Patent
Matsuki et al.

(10) Patent No.: US 8,466,053 B2
(45) Date of Patent: Jun. 18, 2013

(54) METHOD OF MANUFACTURING SEMICONDUCTOR DEVICE, AND SEMICONDUCTOR DEVICE

(75) Inventors: Takeo Matsuki, Kanagawa (JP); Nobuyuki Mise, Tsukuba (JP)

(73) Assignee: Renesas Electronics Corporation, Kanagawa (JP)

( * ) Notice: Subject to any disclaimer, the term of this patent is extended or adjusted under 35 U.S.C. 154(b) by 13 days.

(21) Appl. No.: 13/074,569

(22) Filed: Mar. 29, 2011

(65) Prior Publication Data

US 2011/0241087 A1 Oct. 6, 2011

(30) Foreign Application Priority Data

Mar. 31, 2010 (JP) ................................. 2010-080474

(51) Int. Cl.
*H01L 21/3205* (2006.01)

(52) U.S. Cl.
USPC ........... 438/591; 438/595; 438/257; 438/261; 257/288

(58) Field of Classification Search
USPC .................. 438/591, 595, 257, 261; 257/288, 257/E21.058, E29.242
See application file for complete search history.

(56) References Cited

U.S. PATENT DOCUMENTS

| 7,026,199 | B2 | 4/2006 | Lee | |
|---|---|---|---|---|
| 2003/0216000 | A1* | 11/2003 | Beaman et al. | 438/257 |
| 2008/0299723 | A1* | 12/2008 | Wu et al. | 438/251 |

FOREIGN PATENT DOCUMENTS

JP 2005-136376 A 5/2005

OTHER PUBLICATIONS

F. Ootsuka et al. Full-Metal-Gate Integration of Dual-Metal-Gate HfSiON CMOS Transistors by Using Oxidation-Free Dummy-Mask Process, Extended Abstracts of the 2006 International Conference on Solid State Devices and Materials, 2006, pp. 1116-1117.

* cited by examiner

*Primary Examiner* — Theresa T Doan
(74) *Attorney, Agent, or Firm* — Foley & Lardner LLP

(57) ABSTRACT

A gate insulating film is formed on a substrate. Next, a gate electrode film is formed on the gate insulating film. A mask film is formed on a portion of the gate electrode film. The gate electrode film is selectively removed by etching using the mask film as a mask. A gate sidewall film is formed so as to be in contact with the lateral surfaces of the mask film and the gate electrode film. The mask film is formed of a laminated film in which at least a first film, a second film and a third film are laminated in this order. The second film has a higher etching selectivity ratio than that of the third film with respect to the gate sidewall film. The third film has a higher etching selectivity ratio than that of the second film with respect to the gate electrode film.

8 Claims, 3 Drawing Sheets

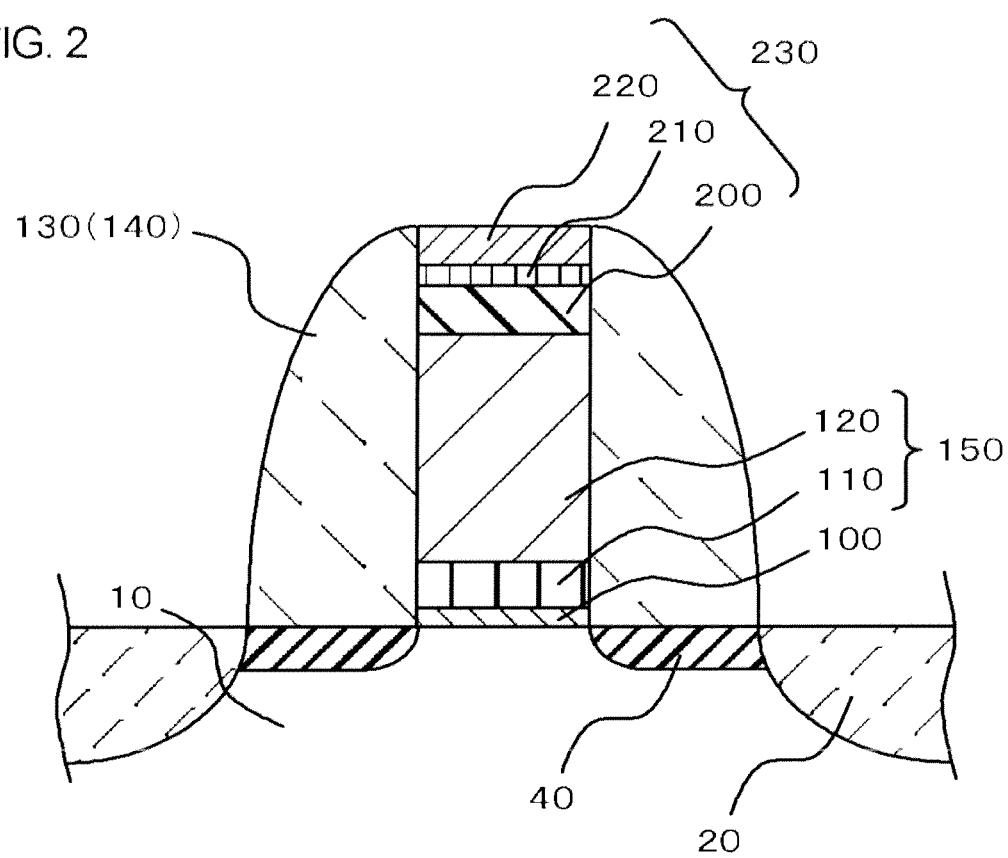

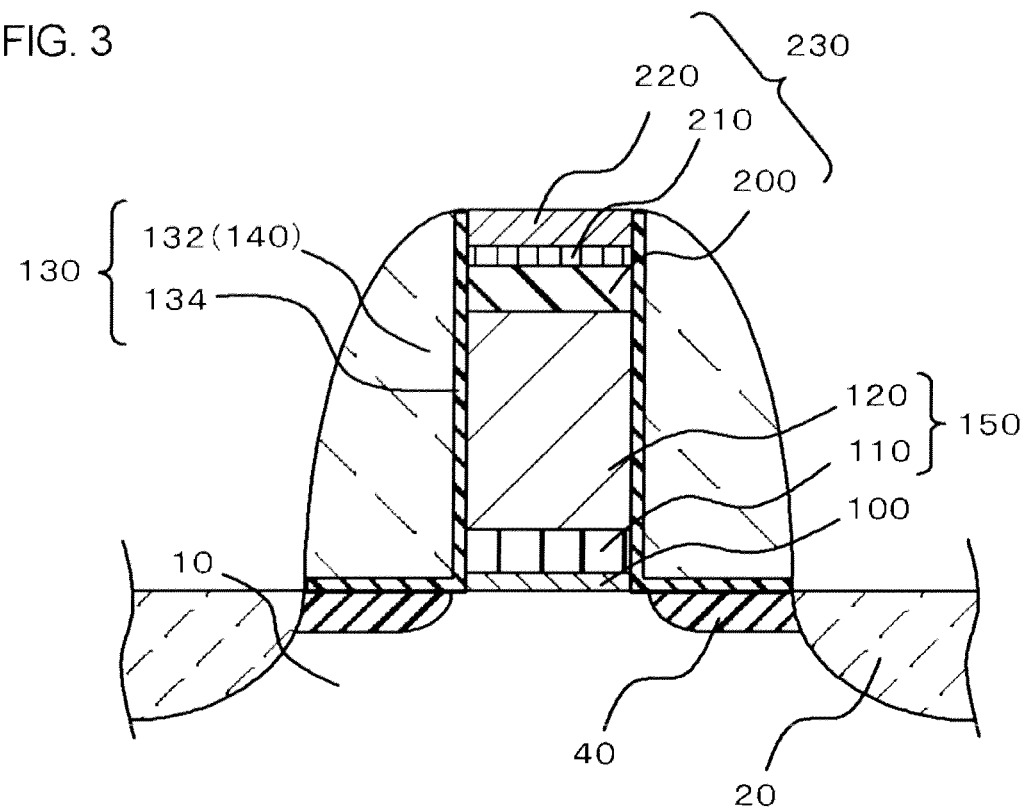

METHOD OF MANUFACTURING SEMICONDUCTOR DEVICE, AND SEMICONDUCTOR DEVICE

This application is based on Japanese patent application No. 2010-080474, the content of which is incorporated herein by reference.

BACKGROUND

1. Technical Field

The present invention relates to a method of manufacturing a semiconductor device having a field-effect transistor, and the semiconductor device.

2. Related Art

There may be a case where a gate electrode of a field-effect transistor is formed of a metal material. This is intended to efficiently apply a gate voltage to a channel region to thereby improve performance of a field-effect transistor. However, when the gate electrode formed of a metal material is etched, use of a resist as a mask causes the etching rate of the mask to be higher than that of the metal material.

A method of manufacturing a field-effect transistor to which a hard mask is applied in etching of the gate electrode is disclosed in "Full-Metal-Gate Integration of Dual-Metal-Gate HfSiON CMOS Transistors by Using Oxidation-Free Dummy-Mask Process" Written by F. Ootsuka, Y. Tamura, Y. Akasaka, S. Inumiya, H. Nakata, M. Ohtsuka, T. Watanabe, M kitajima, Y. Nara and K. Nakamura: Extended Abstracts of the 2006 International Conference on Solid State Devices and Materials, Yokohama, 2006, pages 1116 to 1117 (hereinafter, simply referred to as Non-Patent Document 1). Thereby, it is possible to selectively remove the gate electrode film formed of a metal material by etching. In addition, Japanese Unexamined Patent Publication No. 2005-136376 discloses a technique in which the hard mask is formed of a two-layered film. At this time, the upper film of the films included in the hard mask is formed of a material having a high etching selectivity ratio with respect to a gate sidewall film.

SUMMARY

In an etch-back process of forming a gate sidewall film, overetching is performed in order to improve the uniformity within the surface of the substrate. In the technique disclosed in Non-Patent Document 1, after the gate sidewall film is formed, the hard mask is thinned or eliminated. In this case, there is a possibility that the gate electrode is contaminated by a subsequent process. On the other hand, according to the technique disclosed in Japanese Unexamined Patent Publication No. 2005-136376, the upper film of the films included in the hard mask is formed of a material having a high etching selectivity ratio with respect to the gate sidewall film. For this reason, the thickness of the hard mask can be maintained. However, in this case, it is difficult for the upper film of the hard mask to have etching selectivity ratio with respect to the gate electrode film. Consequently, the film having a high etching selectivity ratio with respect to the gate sidewall film needs a certain degree of thickness, and the hard mask remaining on the gate electrode after the formation of the gate sidewall film is thickened. For this reason, the difference in level after the formation of an insulating interlayer becomes larger.

In one embodiment, there is provided a method of manufacturing a semiconductor device, including: forming a gate insulating film over a substrate; forming a gate electrode film over the gate insulating film; forming a mask film over a portion of the gate electrode film; selectively removing the gate electrode film by etching using the mask film as a mask; and forming a gate sidewall film so as to be in contact with the lateral surfaces of the mask film and the gate electrode film, wherein the mask film has a laminated film in which at least first, second, and third films are laminated in this order, the second film has a higher etching selectivity ratio than that of the third film with respect to the gate sidewall film, and the third film has a higher etching selectivity ratio than that of the second film with respect to the gate electrode film.

According to the invention, the mask film has a laminated film in which at least the first, second, and third films are laminated in this order. The second film included in the mask film has a high etching selectivity ratio with respect to the gate sidewall film. Consequently, it is possible to suppress contamination of the gate electrode compared to a case where the second film is not provided. In addition, the third film has a higher etching selectivity ratio than that of the second film with respect to the gate electrode film. For this reason, it is possible to reduce the thickness of the second film. The second film has a higher etching selectivity ratio than that of the third film with respect to the gate sidewall film. For this reason, it is possible to remove the third film in an etch-back process even when the thickness of the second film is reduced. Therefore, it is possible to reduce the thickness of the mask film on the gate electrode film remaining after the formation of the gate sidewall film.

In another embodiment, there is provided a semiconductor device including: a substrate; a gate insulating film provided over the substrate; a gate electrode film provided over the gate insulating film; a mask film provided over the gate electrode film, and having a laminated film in which at least first, second, and third films are laminated in this order; and a gate sidewall film which is in contact with the lateral surfaces of the gate electrode film and the mask film, wherein the second film has a higher etching selectivity ratio than that of the third film with respect to the gate sidewall film, and the third film has a higher etching selectivity ratio than that of the second film with respect to the gate electrode film.

According to the invention, it is possible to prevent the gate electrode from being contaminated, and to reduce the thickness of the mask film formed on the gate electrode.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a cross-sectional view illustrating the semiconductor device formed by the manufacturing method shown in FIGS. 1A to 1C.

FIG. 3 is a cross-sectional view illustrating the semiconductor device according to a second embodiment.

DETAILED DESCRIPTION

Figure 1A:
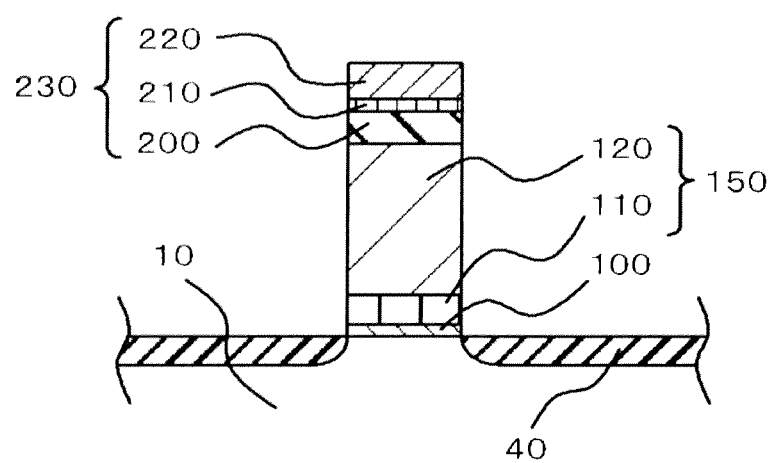
FIGS. 1A to 1C are cross-sectional views illustrating a method of manufacturing a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

Figure 1B:
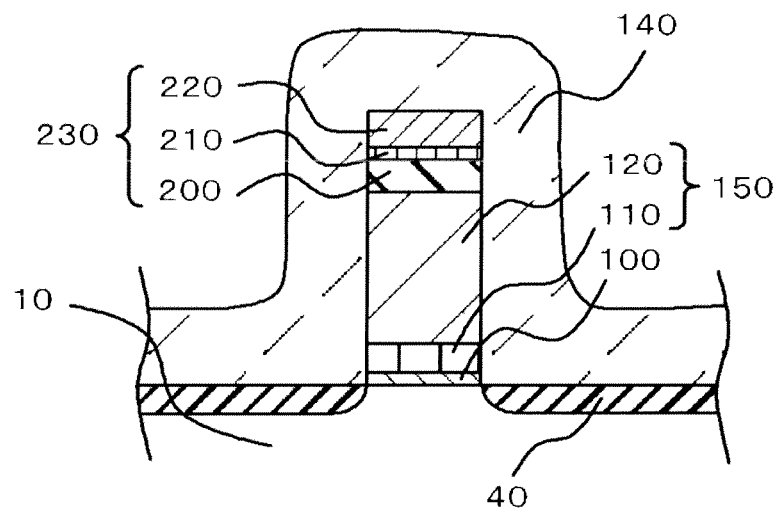
Figure 1C:
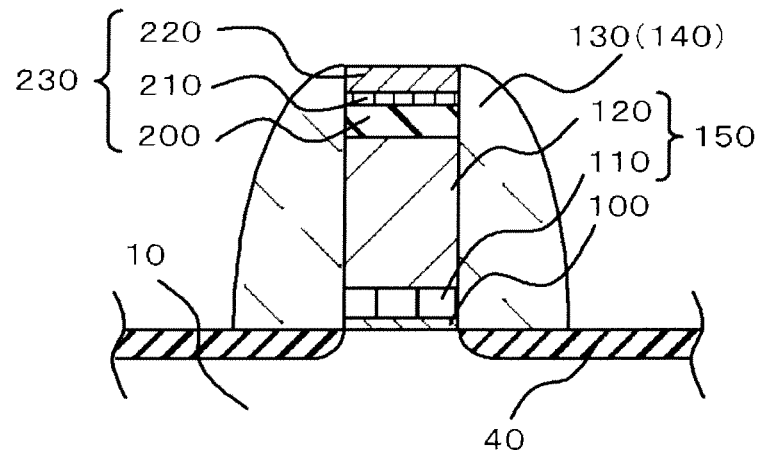

FIGS. 1A to 1C are cross-sectional views illustrating a method of manufacturing a semiconductor device according to a first embodiment. FIG. 2 is a cross-sectional view illustrating the semiconductor device formed by the manufacturing method shown in FIGS. 1A to 1C. In the manufacturing method, first, a gate insulating film 100 is formed on a substrate 10. Next, a gate electrode film 120 is formed on the gate insulating film 100. A mask film 230 is formed on a portion of the gate electrode film 120. The mask film 230 is constituted by a first film 200, a second film 210, and a third film 220. The gate electrode film 120 is selectively removed by etching using the mask film 230 as a mask. A gate sidewall film 130 is formed so as to be in contact with the lateral surfaces of the mask film 230 and the gate electrode film 120. After that, an impurity introducing process is performed, whereby the semiconductor device shown in FIG. 2 is formed.

Hereinafter, the method of manufacturing the semiconductor device according to the first embodiment will be described in detail with reference to FIGS. 1A to 1C and FIG. 2. First, as shown in FIG. 1A, the gate insulating film 100 is formed on the substrate 10. The substrate 10 is, for example, a Si substrate. In addition, the gate insulating film 100 is, for example, a laminated film (HfON/SiON) composed of a hafnium oxide film and a silicon oxide film which contain nitrogen. Next, a work function control film 110 is formed on the gate insulating film 100. The work function control film 110 is, for example, a mixed film (TaSiNx), made of tantalum and silicon, which contains nitrogen in case of nFET, and is titanium nitride (TiN) in case of pFET. The work function of the transistor is controlled by the work function control film 110. The gate electrode film 120 is formed on the work function control film 110. The gate electrode film 120 is made of, for example, W. The gate electrode film 120 stabilizes series resistance of a gate electrode 150 described later.

Next, the mask film 230 is formed on a portion of the gate electrode film 120. The mask film 230 is formed by, for example, lithography or dry etching. The mask film 230 is formed of a laminated film in which the first film 200, the second film 210, and the third film 220 are laminated in this order. The third film 220 is formed of, for example, SiN, and has a higher etching selectivity ratio than that of the second film 210 with respect to the gate electrode film 120. The second film 210 is formed of, for example, $SiO_2$, and has a higher etching selectivity ratio than that of the third film 220 with respect to the gate sidewall film 130 described later. The first film 200 is formed of, for example, SiN.

The gate electrode film 120, the work function control film 110, and the gate insulating film 100 are selectively removed by etching using the mask film 230 as a mask. Thereby, the gate electrode 150 is formed. The gate electrode 150 is formed of the gate electrode film 120 and the work function control film 110. After that, impurity ions are implanted into the substrate 10 using the gate electrode 150 as a mask, and an extension region 40 is formed.

Next, as shown in FIG. 1B, an insulating film 140 is formed over the entire area including the upper surface and the lateral surface of the gate electrode 150. The insulating film 140 is formed of, for example, SiN. As shown in FIG. 1C, this insulating film 140 is etched back, and the gate sidewall film 130 is formed. This etch back is performed using, for example, a mixed gas of $CH_2F_2$ or $CHF_3$, and Ar and $O_2$.

After that, impurity ions are implanted into the substrate 10 using the gate electrode 150 and the gate sidewall film 130 as a mask. Thereby, as shown in FIG. 2, a source and drain region 20 is formed in the substrate 10.

Next, operations and effects of the embodiment will be described. According to the embodiment, the mask film 230 is formed of a laminated film in which the first film 200, the second film 210, and the third film 220 are laminated in this order. The second film 210 has a high etching selectivity ratio with respect to the gate sidewall film 130, and is difficult to be etched in the conditions for etching the gate sidewall film 130. Consequently, in the etch-back process, thinning of the mask film 230 is suppressed, whereby it is possible to suppress contamination of the gate electrode 150.

In addition, the third film 220 has a higher etching selectivity ratio that of the second film 210 with respect to the gate electrode film 120, and is more difficult to be etched than the second film 210 in the conditions for etching the gate electrode film 120. Consequently, it is possible to reduce the thickness of the second film 210. The second film 210 has a higher etching selectivity ratio than that of the third film 220 with respect to the gate sidewall film 130, and is more difficult to be etched than the third film 220 in the conditions for etching the gate sidewall film 130. Thereby, even when the thickness of the second film 210 is reduced, it is possible to remove the third film 220 in the etch-back process. Therefore, it is possible to reduce the thickness of the mask film 230 remaining on the gate electrode 150 after the formation of the gate sidewall film 130.

FIG. 3 shows the semiconductor device according to a second embodiment, and corresponds to FIG. 2 according to the first embodiment. A method of manufacturing the semiconductor device shown in FIG. 3 is the same as the method of manufacturing the semiconductor device according to the first embodiment except that it has a step of forming a gate sidewall film 134 after the formation of the gate electrode 150 and before the formation of the extension region 40. In addition, the semiconductor device shown in FIG. 3 is the same as the semiconductor device according to the first embodiment except that the gate sidewall film 130 is constituted by two layers of a gate sidewall film 132 and the gate sidewall film 134.

A method of forming the gate sidewall film 130 is as follows. As shown in FIG. 3, the gate sidewall film 134 is deposited over the entire area including the upper surface and the lateral surface of the gate electrode 150. Next, impurity ions are implanted into the substrate 10, and the extension region 40 is formed. The insulating film 140 is formed over the entire area including the upper surface and the lateral surface of the gate electrode 150. Next, the gate sidewall film 132 is formed by etching the insulating film 140. The gate sidewall film 132 and the gate sidewall film 134 are formed of, for example, SiN and SiN, $SiO_2$ and SiN, or SiN and $SiO_2$, respectively.

Even in the embodiment, the mask film 230 is formed of a laminated film in which the first film 200, the second film 210, and the third film 220 are laminated in this order. The second film 210 has a high etching selectivity ratio with respect to the gate sidewall film 130. In addition, the third film 220 has a higher etching selectivity ratio than that of the second film 210 with respect to the gate electrode film. Further, the second film 210 has a higher etching selectivity than that of the third film 220 with respect to the gate sidewall film 130. Therefore, it is possible to obtain the same effect as that of the first embodiment.

Meanwhile, according the above-mentioned embodiment, the following invention is also disclosed. A method of manufacturing a semiconductor device is provided, which includes: forming a gate insulating film over a substrate;

forming a gate electrode film over the gate insulating film; forming a mask film over a portion of the gate electrode film; selectively removing the gate electrode film by etching using the mask film as a mask; and forming a gate sidewall film so as to be in contact with the lateral surfaces of the mask film and the gate electrode film, wherein the mask film has a laminated film in which a first film (second film 210 in the embodiment) and a second film (third film 220 in the embodiment) are laminated in the surface thereof in this order, the first film has a higher etching selectivity ratio than that of the second film with respect to the gate sidewall film, and the second film has a higher etching selectivity ratio than that of the first film with respect to the gate electrode film.

As described above, although the embodiments of the invention have been set forth with reference to the drawings, they are merely illustrative of the invention, and various configurations other than those stated above can be adopted.

It is apparent that the present invention is not limited to the above embodiments, and may be modified and changed without departing from the scope and spirit of the invention.

What is claimed is:

1. A method of manufacturing a semiconductor device, comprising:
   forming a gate insulating film over a substrate;
   forming a gate electrode film aver said gate insulating film;
   forming a mask film over a portion of said gate electrode film;
   selectively removing said gate electrode film by etching using said mask film as a mask; and
   forming a gate sidewall film so as to be in contact with the lateral surfaces of said mask film and said gate electrode film,
   wherein said mask film has a laminated film in which at least first, second, and third films are laminated in this order, wherein said third film directly contacts said second film,
   said second film has a higher etching selectivity ratio than that of said third film with respect to said gate sidewall film, and
   said third film has a higher etching selectivity ratio than that of said second film with respect to said gate electrode film.

2. The method of manufacturing a semiconductor device as set forth in claim 1, wherein said gate sidewall film is formed of SiN.

3. The method of manufacturing a semiconductor device as set forth m claim 1, wherein said gate second film is formed of $SiO_2$.

4. The method of manufacturing a semiconductor device as set forth in claim 1, wherein said third film is formed of SiN.

5. The method of manufacturing a semiconductor device as set forth in claim 1, wherein said step of forming the gate sidewall film includes:
   forming an insulating flint over the upper surface and the lateral surface of a gate electrode; and
   etching back using a mixed gas of $CH_2F_2$ or $CHF_3$, and Ar and $O_2$.

6. A semiconductor device comprising:
   a substrate;
   a gate insulating film provided over said substrate;
   a gate electrode film provided over said gate insulating film;
   a mask film provided over said gate electrode film, and having a laminated film which at least first, second, and third films are laminated in this order, wherein said third film directly contacts said second film; and
   a gate sidewall film which is in contact with the lateral surfaces of said gate electrode film and said mask film,
   wherein said second film has a higher etching selectivity ratio than that of said third film with respect to said gate sidewall film, and
   said third film has a higher etching selectivity ratio than that of said second film with respect to said gate electrode film.

7. The method of manufacturing a semiconductor device as set forth in claim 1, wherein said second film directly contacts said first film.

8. A method of manufacturing a semiconductor device, comprising:
   forming a gate insulating film over a substrate;
   forming a gate electrode film over said gate insulating film, wherein said gate electrode film comprises a metallic material;
   forming a mask film over as portion of said gate electrode film;
   selectively removing said gate electrode film by etching using said mask film as a mask; and
   forming a gate sidewall film so as to be in contact with the lateral surfaces of said mask film and said gate electrode film,
   wherein said mask film has a laminated film in which at least first, second, and third films are laminated in this order,
   said second film has a higher etching selectivity ratio than that of said third film with respect to said gate sidewall film, and
   said third film has a higher etching selectivity ratio than that of said second film with respect to said gate electrode film.

* * * * *